United States Patent [19]

Kawaguchi et al.

[11] Patent Number: 5,677,501
[45] Date of Patent: Oct. 14, 1997

[54] FLOW DISPLAY TYPE INDICATING METHOD AND APPARATUS

[75] Inventors: Ei Kawaguchi; Masaaki Nagai, both of Kanagawa-ken, Japan

[73] Assignee: Leader Electronics Corp., Yokohama, Japan

[21] Appl. No.: 694,340

[22] Filed: Aug. 8, 1996

[30] Foreign Application Priority Data

Aug. 11, 1995 [JP] Japan .................. 7-205957

[51] Int. Cl.$^6$ .................. G01F 23/14
[52] U.S. Cl. .................. 73/866.3
[58] Field of Search .................. 73/866.3; 340/815.4, 340/815.45, 815.73; 349/1, 11, 33

[56] References Cited

U.S. PATENT DOCUMENTS

| 4,753,117 | 6/1988 | Osterhout et al. .................. 73/866.3 |
| 4,756,186 | 7/1988 | Sangawa .................. 73/119 A |

OTHER PUBLICATIONS

Catalog of Satellite Signal Level Checker, Maspro Denkoh Corp., Nov. 1994.
Instruction Manual of TV Signal Lever Meter, Leader Electronics Corp., pp. 1–4 to 1–6, 2–1 to 2–7, and 3–14, Apr. 1992.
Operating Manual of Tricoder, pp. 1, 15–17 and 25, Dec. 10, 1992.
Catalog of HF Transceiver (Model TS–50), Kenwood Corp., Apr. 25, 1993.

*Primary Examiner*—Robert Raevis
*Attorney, Agent, or Firm*—Fish & Richardson P.C.

[57] ABSTRACT

A flow display type indicator is provided which indicates the variation or the velocity of variation of the value of a physical quantity or a parameter in a readily identifiable form. The indicator includes a flow image forming unit to indicate the value of the predetermined physical quantity in a flow representation by enabling a flow representing image to be formed at one of a plurality of positions including first to n-th positions which are orderly disposed and offset from each other along a predetermined line. A flow image selector selects one from flow representing images at the first to the n-th positions in one of first and second directions depending on the polarity of an input signal at a speed in accordance with the magnitude of the input signal to allow the flow representing image forming unit to form a selected flow representing image.

29 Claims, 11 Drawing Sheets

| ADDRESS | FLOW IMAGE POSITION SELECTION WORD SW | | | |
|---|---|---|---|---|
| | SW1 | SW2 | SW3 | SW4 |
| 0 | 0 | 1 | 1 | 1 |
| 1 | 1 | 0 | 1 | 1 |
| 2 | 1 | 1 | 0 | 1 |
| 3 | 1 | 1 | 1 | 0 |

FLOW DISPLAY TYPE INDICATING METHOD AND APPARATUS

BACKGROUND OF THE INVENTION

1. Field of the Invention

The present invention relates to an indicating method and apparatus for providing an indication of the value of a variety of physical quantities or parameters under measurement, and more particularly, to a flow display type indicating method and apparatus for providing indication of a value having a polarity and a magnitude in the form of flow representation.

2. Description of Related Arts

Conventional indicators may be classified, by the form of indication for certain values, into analog and digital display types. Analog display indicators include a bar graph display indicator which electronically displays values in an analog form. Digital display indicators, on the other hand, generally provide indications with numerical values. In addition, there is also an indicator for a polarity, which is composed of a pair of indicating elements in order to provide a positive or negative polarity indication.

In some measurement applications, it is often desired to know a maximum or minimum point of measured values for a certain physical quantity or a parameter. For example, when the orientation of an antenna is to be adjusted, a field strength meter is generally utilized to measure a received field strength during the adjustment of the antenna in order to detect a position of the antenna at which the maximum value of the received field strength occurs. In this event, if an indicator provided in the field strength meter only has a digital display, a digital value itself is not a direct indication of the velocity of variation of the value (the direction and speed of the variation), thus causing a problem that the direction and speed of the variation of the value is not easy to determine. On the other hand, a field strength meter having a bar graph indicator, which provides indications of absolute values, allows the user to determine the velocity of variation of the value. However, a large number of display segments or a large display area is required for a resolution desired to facilitate the adjustment of an antenna. In addition, although some field strength meters have a combination of the two types of indicators, problems inherent to the respective indicators are not completely solved, thus still leaving unsolved the problem that maximum points are not easy to grasp. A similar problem is also encountered when the minimum value of a parameter is to be detected, for example, when the minimum point or bottom in the characteristic of a band-rejection filter is detected.

SUMMARY OF THE INVENTION

It is therefore an object of the present invention to provide a method and apparatus for indicating the value of a physical quantity or a parameter, or the velocity of variation thereof in a readily determinable manner.

It is another object of the present invention to provide a method and apparatus for indicating values of a physical quantity or a parameter, or the velocity of variation thereof, which are suitable for use in combination with a digital display.

It is a further object of the present invention to provide a method and apparatus for indicating the value of a physical quantity or a parameter, or the velocity of variation thereof, which require a smaller display area.

It is a still further object of the present invention to provide an indicating method and apparatus which facilitate easy finding of the maximum and/or minimum point in the value of a physical quantity or a parameter.

To achieve the above objects, the present invention provides a method of indicating a value of a predetermined physical quantity in a form of flow representation, said value having a polarity and a magnitude, said method comprising the steps of: defining a flow representing image for representing a flow; indicating the polarity of said value by at least one direction of flow of said flow representing image along a predetermined line; and indicating the magnitude of said value by a speed of flow of said flow representing image.

According to the present invention, said flow representing image may comprise at least one image element movable along said predetermined line. Also, said predetermined line may be a straight line, a curved line, or a radial line.

Further, said at least one image element may comprise a plurality of image elements spaced apart from each other. The plurality of image elements may be spaced at uniform or non-uniform intervals.

Also, the at least one image element may be bright or dark relative to surroundings. The at least one image element may have a uniform or similar shape or a non-uniform or dissimilar shape along said predetermined line. The at least one image element may have a uniform or non-uniform size along said predetermined line.

The at least one direction of flow may comprise two directions opposite to each other along said predetermined line, one of said two directions representing a positive polarity, the other of said two directions representing a negative polarity.

The speed of flow of said flow representing image may have a linear or non-linear relationship with the magnitude of the value of said physical quantity. The flow representing image may be repetitively moved over a finite distance.

The polarity of the value of said physical quantity may represent a polarity relative to a predetermined reference value. The value of said physical quantity may be a differentiated value of said physical quantity.

Further, the present invention provides a flow display type indicator for indicating a value of a predetermined physical quantity, comprising: an input terminal for receiving an input signal representative of a value of said predetermined physical quantity; flow representing image forming means for forming a flow representing image at an n number of different positions along a predetermined line, said n positions comprising first to n-th positions orderly disposed and being offset from each other, said first position defining a position next to said n-th position in a first direction, said n-th position defining a position next to said first position in a second direction opposite to said first direction; and flow representing image selecting means connected to said flow representing image forming means, for selecting said flow representing images at said first to n-th positions in one of said first and second directions depending on a polarity of a first signal received from said input terminal and at a speed in accordance with a magnitude of said first signal, in order to cause said flow representing image forming means to form the selected flow representing image.

According to the present invention, said flow representing image selecting means may be connected to said input terminal for receiving an input signal received at said input terminal as said first signal.

The flow display type indicator according to the present invention may further comprise differentiating means connected between said input terminal for receiving a value of said predetermined physical quantity and said flow representing image selecting means, for generating a differential of the value of said predetermined physical quantity and for supplying said flow representing image selecting means with said differential value as said first signal, whereby said indicator is operative to indicate a velocity of variation of the value of said predetermined physical quantity.

The flow representing image selecting means may include: polarity detector means for detecting a polarity of said first signal relative to a predetermined reference value to generate a polarity signal representative of the detected polarity; magnitude detector means for detecting a magnitude of said first signal relative to said predetermined reference value to generate a magnitude signal representative of the detected magnitude; and flow representing image position selector means connected to receive said polarity signal and said magnitude signal and having an output connected to said flow representing image forming means, said selector means being responsive to said polarity signal and said magnitude signal to generate a position selecting signal for selecting one from said first to n-th positions of said flow representing images in one of said first and second directions depending on the polarity represented by said polarity signal and at a speed in accordance with the magnitude represented by said magnitude signal, whereby said flow representing image forming means receives said position selecting signal to form said flow representing image at one of the positions represented by said position selecting signal.

According to the present invention, the flow representing image forming means may include: a T number of a plurality of display segments arranged along said predetermined line; and control means for controlling said T display segments to form at least one image element movable along said predetermined line. When said predetermined line is a straight line, said T display segments may be arranged along said straight line. When said predetermined line is a curved line, said T display segments may be arranged along said curved line. When the predetermined line is a radial line, said T display segments may be arranged along said radial line.

According to the present invention, the at least one image element may comprise a plurality of an m number of a plurality of image elements spaced apart from each other, where T being equal to n multiplied by m; and the T segments being divided into an m number of groups each including an n number of display segments.

Also, the at least one image element may be bright or dark relative to surroundings, and each of said display segments forms a bright or dark image element when the each display segment is enabled.

BRIEF DESCRIPTION OF THE DRAWINGS

The present invention will hereinafter be described in connection with the preferred embodiment thereof with reference to the accompanying drawings:

FIGS. 3A–3D illustrate flow images at four different positions which are formed by the flow image forming unit of FIG. 1, where

FIGS. 5A and 5B illustrate other examples of the flow representation which have different values as the number of flow image composing elements m, where FIG. 5A is an example of m=2, and FIG. 5B is an example of m=4;

FIGS. 6A and 6B illustrate other examples of the flow representation which have different values as the number of flow images n (or the number of flow image positions), where FIG. 6A is an example of n=3, and FIG. 6B is an example of n=2;

FIGS. 7A–7C illustrate examples of the flow representation which have uniformly sized image elements or display segments, wherein

DESCRIPTION OF THE PREFERRED EMBODIMENTS

Figure 1:
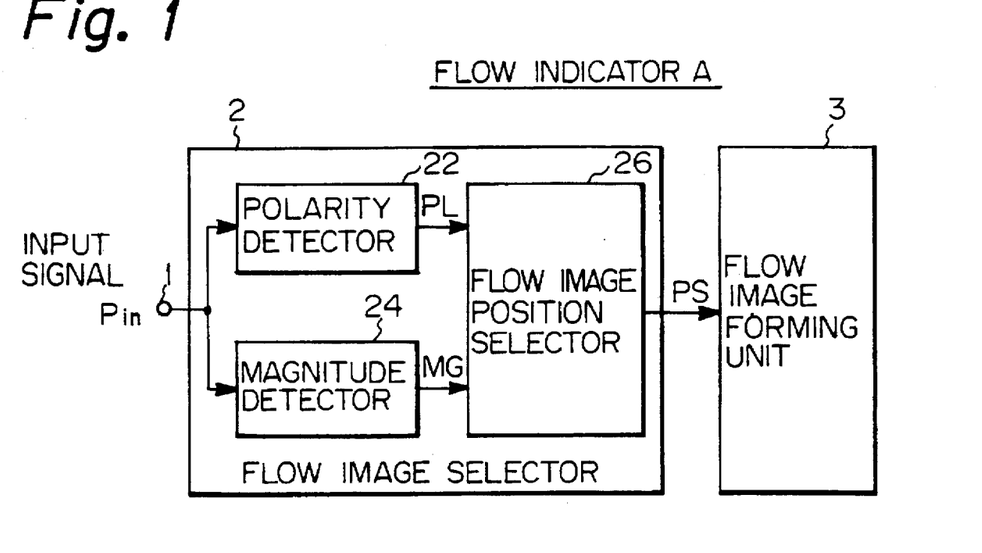
FIG. 1 is a block diagram illustrating a first embodiment of a flow display type indicator (also called a flow indicator) according to the present invention.

Referring to FIG. 1, it is shown a block diagram illustrating a flow display type indicator A (hereinafter simply called a "flow indicator") according to a first embodiment of the present invention. The flow indicator A comprises an input terminal 1 for receiving an input signal Pin indicative of the value of a physical quantity; a selector 2 having an input coupled to the input terminal 1 for selecting a flow representing image (hereinafter simply called a "flow image"); and a flow image forming unit 3. The selector 2 responds to the polarity and magnitude of the input signal Pin received at its input to generate a flow image position selecting signal PS at its output for selecting one from flow images FI1–FIn located at n positions which are offset in order along a predetermined line L (see FIG. 2). The flow image forming unit 3 receives the selecting signal PS at its input, and produces one of the flow images FI1–FIn indicated by the signal PS. The flow image forming unit 3 may be implemented using a liquid crystal display, for example.

More specifically, the selector 2 comprises, as an exemplary implementation, a polarity detector 22, a magnitude detector 24, and a flow image position selector 26. The polarity detector 22 detects the polarity of the input signal Pin relative to a reference value R (which may be zero or any other value), and generates a polarity signal PL indicative of the detected positive (including zero) or negative polarity at its output. The magnitude detector 24 detects the magnitude of the signal Pin relative to the reference value R, i.e., the absolute value of the difference between the reference value R and the signal Pin, and generates a signal MG indicative of the absolute value at its output. The flow image position selector 26 has inputs for receiving the signals PL and MG, respectively, and generates the flow image position selecting signal PS which selects the flow images FI1–FIn one after another in a first direction along the line L when the polarity signal PL indicates the positive polarity, or in a second direction opposite to the first direction when the polarity signal PL indicates the negative polarity, and at a speed depending upon the magnitude of the signal MG.

Figure 2:
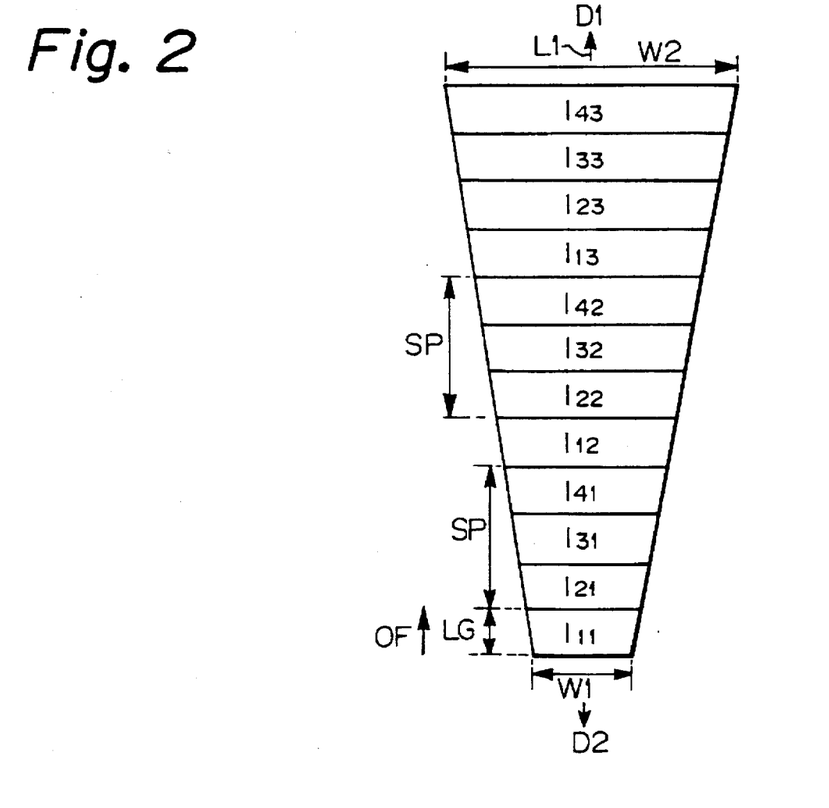
FIG. 2 illustrates an example of image elements for composing flow images FI in a representation of flow which is provided by a flow image forming unit shown in FIG. 1, where only contours of the respective image elements are shown.
Figure 3A:
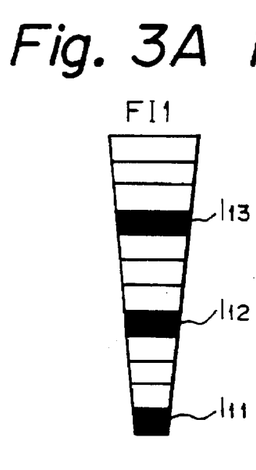
FIG. 3A illustrates a flow image FI1 at a first position (the lowest position)
Figure 3B:
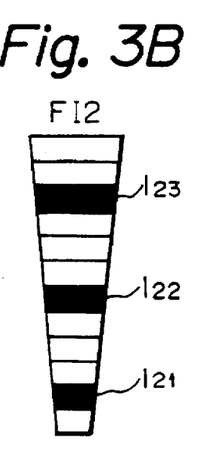
FIG. 3B a flow image FI2 at a second position.
Figure 3C:
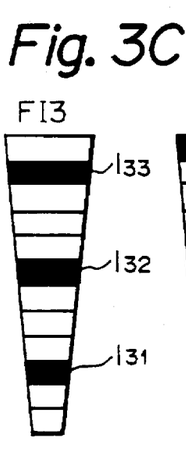
FIG. 3C a flow image FI3 at a third position.
Figure 3D:
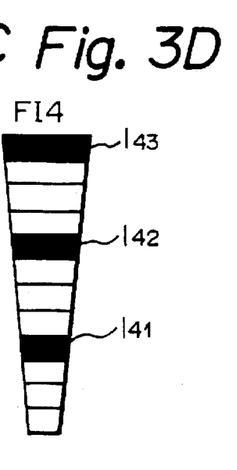
FIG. 3D a flow image FI4 at a fourth position (the highest position)

FIG. 2 illustrates an example of image elements which compose flow images FI in a flow representation provided by the flow image forming unit 3. It should be noted that only contours of the image elements are illustrated in FIG. 2. In this example, the flow representation is described on the assumption that the flow image forming unit 3 is implemented using a liquid crystal display, wherein the liquid crystal display has 12 display segments, and each segment has a length l. Here, the flow representation is provided by a three image element-four position flow image, wherein a total number T of flow image composing image elements is 12, a number m of image elements composing each flow image is 3, and a number n of flow images (or number of flow image positions) is 4. Each of the flow images is composed of three image elements along a line L1 (in this example a vertical line), and the flow images appear at four positions offset in order along the line L1.

More specifically, as illustrated in FIGS. 3A–3D, a flow image FI1 (FIG. 3A) at a first position (the lowest position) is composed of the lowest image element I11, the fourth image element I12 from the lowest image element I11 in the upward direction, and the fourth image element I13 from the image element I12 in the upward direction. Similarly, a flow image FI2 (FIG. 3B) at a second position is composed of image elements I21, I22 and I23; a flow image FI3 (FIG. 3C) at a third position is composed of image elements I31, I32 and I33; and a flow image FI4 (FIG. 3D) at a fourth position (the highest position) is composed of image elements I41, I42 and I43 (the image element at the top). An offset OF between adjacent flow images is equal to 1. It should be noted that in FIGS. 3A–3D, elements blacked out indicate selected image elements which should be regarded as being bright over surroundings in this example.

Now, the flow representation will be described in detail. Each of the image elements has a trapezoidal shape, and they are all similar in shape. Also, they all have a length LG along the line L1 equal to 1. With respect to the width orthogonal to the line L1 (average value), the lowest image element I11 has the narrowest width W1, and image elements at higher positions have wider widths. Then, the top image element I43 has the widest width W2. The gradually wider widths of the image elements are useful in visually representing the polarity relationship wherein an upward or first direction D1 indicates the positive polarity, and a downward or second direction D2 indicates the negative polarity. Also, the spacings SP between adjacent image elements in each of the flow images are uniformly selected to be 31. A flow is represented by moving such a flow image in the vertical direction.

Figure 4:
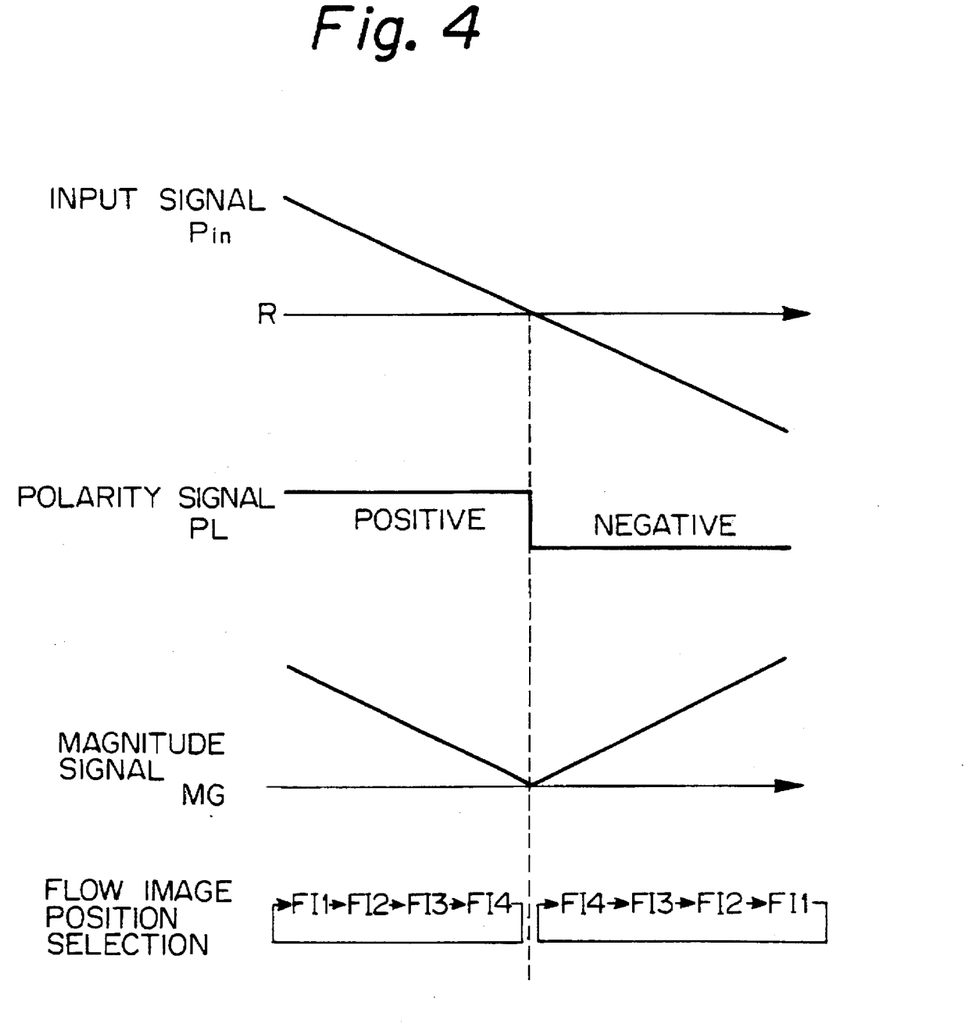
FIG. 4 is a timing chart illustrating the operation of the flow indicator A shown in FIG. 1.

Next, with reference to a timing chart of FIG. 4, the operation of the flow indicator A will be described using the flow representation illustrated in FIG. 2. Assuming that an input signal Pin changes from a positive value to a negative value through a reference value R (zero in this case), as illustrated in FIG. 4, the polarity signal PL indicates the positive polarity while the input signal Pin is in a position domain. Then, the selecting signal PS selects the flow images in the order of FI1 (the lowest flow image) →FI2→FI3→FI4 (the highest flow image). Subsequently, the selecting signal PS again selects the flow images, beginning with FI1 and then in the order of FI2→FI3→FI4. The speed of the selection becomes lower linearly with the magnitude of the signal MG (i.e., the absolute value of the input signal Pin) as the input signal Pin is closer to zero. When the input signal Pin reaches zero, the change in the selected flow image is stopped. Subsequently, when the input signal Pin enters a negative domain, the polarity signal PL indicates the negative polarity. Accordingly, the selecting signal PS selects the flow images, assuming that the flow image selected when the input signal Pin reaches zero is FI3, in the order of FI3→FI2→FI1, and then selects the flow images from the highest flow image FI4 in the order of FI3→FI2→FI1. The speed of the selection in this event becomes higher linearly with the magnitude of the signal MG. By the foregoing operations, the flow indicator A indicates the velocity of variation of the value of the input signal Pin (the direction and speed of the variation) with the direction and speed of the movements of the flow image, thus enabling the user to visually and directly determine the velocity of the variation of the Pin value. Further, since the total number of flow image composing image elements (or the number of display segments) is only 12 which is significantly fewer than required by a conventional bar graph type indicator.

Next, with reference to FIGS. 5A–10, other embodiments of the flow representation having other "flow representing patterns" will be described.

Figure 5A:
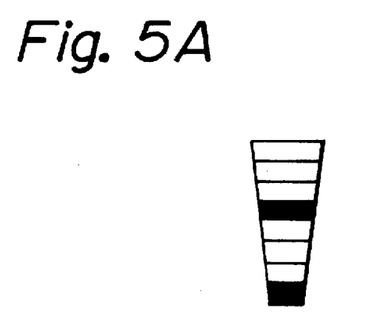
Figure 5B:
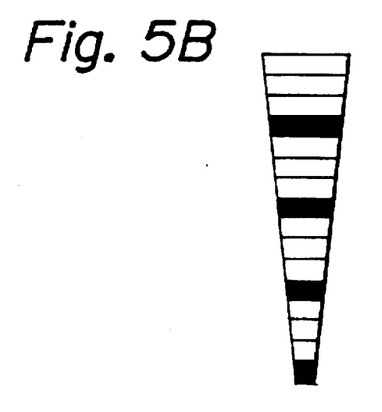

FIGS. 5A and 5B illustrate other embodiments of the flow representation in which the number m of the flow image composing image elements is modified. Specifically, FIG. 5A is an example wherein each flow image is composed of two image elements, i.e., one element less than the example of FIGS. 2 and 3A–3D, while FIG. 5B is an example wherein each flow image is composed of four image elements, i.e., one element more than the example of FIGS. 2 and 3A–3D. It should be noted that the number n of flow images (or the number of flow image positions) is still four. The number m of flow image composing image elements may be at least one, and may be increased or decreased in accordance with particular requirements for the identifiableness of the direction and speed of the flow.

Figure 6A:
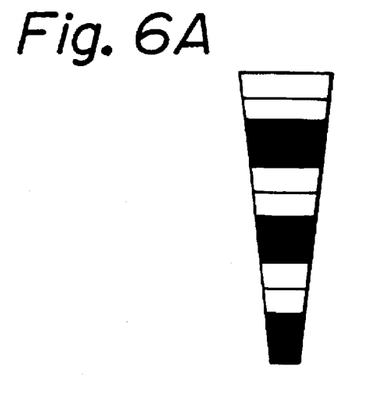
Figure 6B:
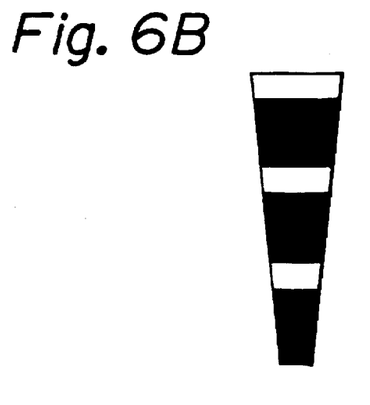

Next, FIGS. 6A and 6B illustrate other examples of the flow representation in which the number of flow images n is changed. Specifically, FIG. 6A illustrates an example in which the number n is three, i.e., one less than the example illustrated in FIGS. 2 and 3A–3D. In other words, the length of each image element LG is 2l, the spacing SP between adjacent image elements is 2l, and the offset OF between adjacent flow image positions is l, i.e., one half of the length LG. FIG. 6B illustrates an example in which the number n is two, i.e., again one less than the example of FIG. 6A. However, if the number n of flow images is excessively reduced, the direction of flow cannot be identified. Generally, the number n is required to be equal to three or more.

It should be noted that while the spacings SP between adjacent image elements in each flow image are uniform in the example illustrated in FIGS. 2 and 3A–3D, the spacings SP may be non-uniform.

Figure 7A:
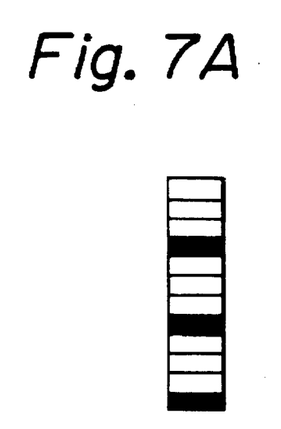
FIG. 7A shows uniform rectangular segments.
Figure 7B:
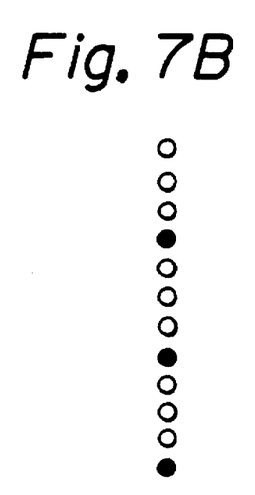
FIG. 7B uniform circular segments.
Figure 7C:
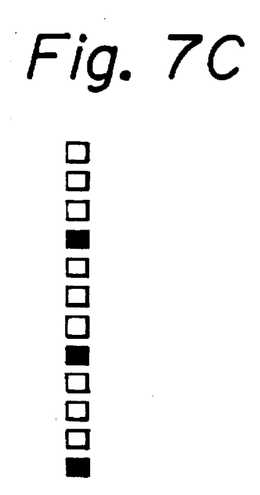
FIG. 7C uniform square segments.

FIGS. 7A–7C illustrate examples of uniformly sized image elements or display segments, wherein FIG. 7A illustrates uniformly sized rectangular elements; FIG. 7B circular elements; and FIG. 7C square elements. The non-uniformly sized elements have been illustrated in FIGS. 2–6B, and another example of non-uniform circular or annular elements is illustrated in FIG. 10, later described.

Also, FIGS. 7A–7C illustrate other examples of image elements or display segments having shapes different from the trapezoidal shape of the example shown in FIGS. 2 and 3A–3D. Further, FIG. 9 shows sectoral image elements, while FIG. 10 shows circular or annular image elements.

Figure 8:
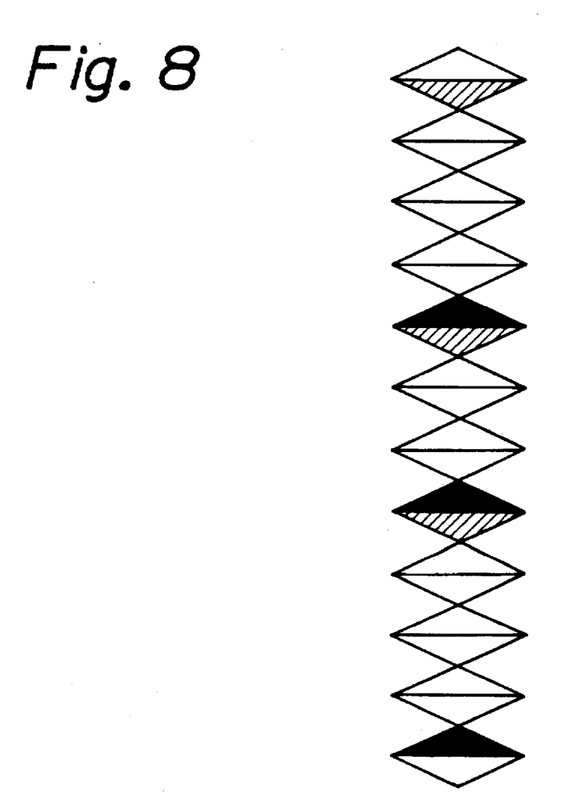
FIG. 8 illustrates another example of the flow representation composed of display segments having different shapes, which include upwardly pointed triangular segments for forming images indicative of an upward direction of flow and downwardly pointed triangular segments for forming images indicative of a downward direction of flow.

FIG. 8 illustrates an example of differently shaped image elements or display segments for forming flow images. Specifically, image elements representing an upward flow are formed by upwardly pointed triangular segments (in the figure, the segments composing one of the flow images are blacked out), and image elements representing a downward flow are displayed by downwardly pointed triangular segments (in the figure, the segments composing one of the flow images are shaded). In this way the two opposite directions are represented by different sets of display segments, respectively. In this case, the triangular segments may be different in size.

Figure 9:
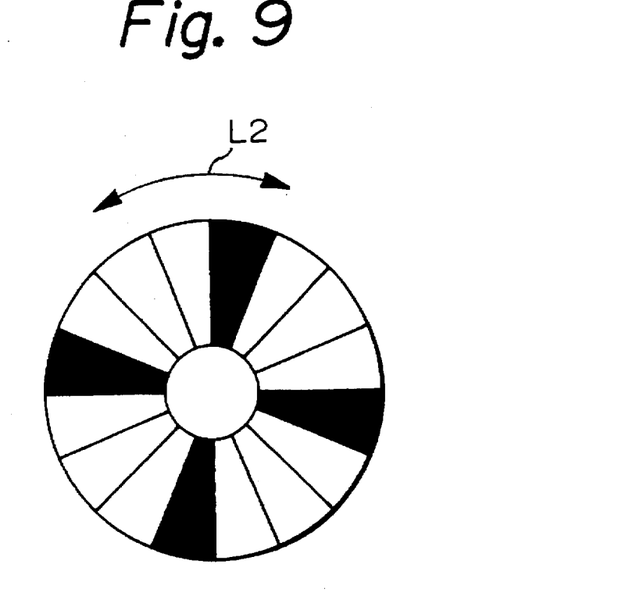
FIG. 9 illustrates another example of the flow representation, where sectoral segments are arranged along a circumferential line L2, which is an example of a curved line, and the clockwise and counterclockwise circumferential directions therearound are defined as directions of flow.
Figure 10:
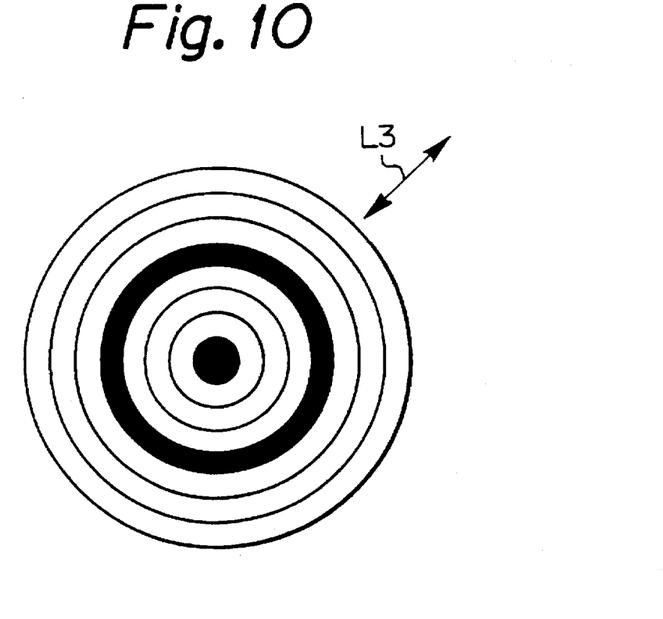
FIG. 10 illustrates a further example of the flow representation, where circular or annular segments are arranged along a radial line L3, and the radial directions are defined as directions of flow.

FIGS. 9 and 10 illustrate other examples of the flow representation having other representations of the direction of flow. While the examples illustrated in FIGS. 2–8 indicate the direction of flow in a vertical or linear fashion, the example illustrated in FIG. 9 is such that sectoral segments are arranged along a circumferential line L2, an example of a curved line, so as to represent the direction of flow in the circumferential direction. The example of FIG. 9 is particularly advantageous in indicating a physical quantity related to an angle. In this case, the counter-clockwise direction may be defined as the positive polarity, while the clockwise direction may be defined as the negative polarity. In the example illustrated in FIG. 10, circular or annular segments are arranged substantially concentrically along a radial line L3 such that the direction of flow is represented by the radial direction. The embodiment of FIG. 10 is particularly advantageous in indicating a physical quantity related to an area, a volume or the like such as expansion and contraction. For example, the radially outward direction may be assigned to the positive polarity (for example, expansion), and the radially inward direction may be assigned to the negative polarity (for example, contraction).

As further examples of the representation of the speed of flow, the flow image moving speed or the speed of selection of flow images may be indicated non-linearly instead of linearly, or continuously or discontinuously with respect to the magnitude of the value of a physical quantity. Also, different ranges of magnitudes of the flow speed may be represented by image elements having variable lengths or image elements having variable spacings.

In FIGS. 2–8 and FIG. 10, the pattern of movement of the flow is such that the flow is repeated in a direction related to the polarity within a finite distance (for example, for representing the positive polarity, the flow is repeated only in the upward direction). While the pattern employed in FIG. 9 is similar in concept, the sectoral segments are arranged to form a complete circular display, so that the flow virtually moves over an infinite distance.

Also, in FIGS. 2–10, the motion of flow is represented by the step-wise shifting of one or more display segments. Alternatively, if images can be represented in a higher resolution, a continuous shift or a shift close to this can also be achieved.

Further, the flow display means may be implemented by a CRT display or any other display means, instead of the liquid crystal display as mentioned above.

Figure 11:
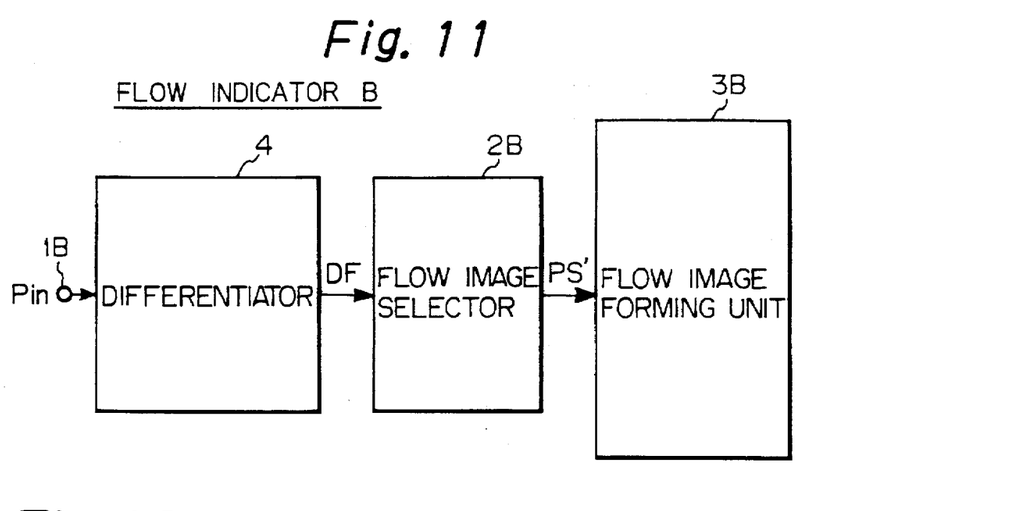
FIG. 11 is a block diagram illustrating a second embodiment of the flow indicator according to the present invention which indicates the differentiated value of a physical quantity.

Next, with reference to FIG. 11, a second embodiment of the flow indicator according to the present invention for indicating a differential of the value of a physical quantity will be described. The illustrated indicator B comprises an input terminal 1B, a flow image selector 2B, and a flow image forming unit 3B, which are all similar to the corresponding components 1, 2 and 3 in FIG. 1. The flow indicator B additionally comprises a differentiator 4 between the input terminal 1B and the flow image selector 2B. The differentiator 4 differentiates an input signal Pin indicative of a physical quantity to generate a differential signal DF at its output. The flow image selector 2B and the flow image forming unit 3B which receive the differential signal DF, operate in completely the same manner as their corresponding components in FIG. 1, which directly receive the input signal Pin, and thus explanation thereof is omitted. The flow indicator B providing a differential indication is advantageous in applications for determining a maximum point or a minimum point (at which the gradient is zero) since the differential value of a physical quantity is indicated in the form of flow representation.

Next, with reference to FIG. 12–18, a TV signal level meter C, which functions as a field strength meter incorporating flow indicator B for indicating a differential will be described.

Figure 12:
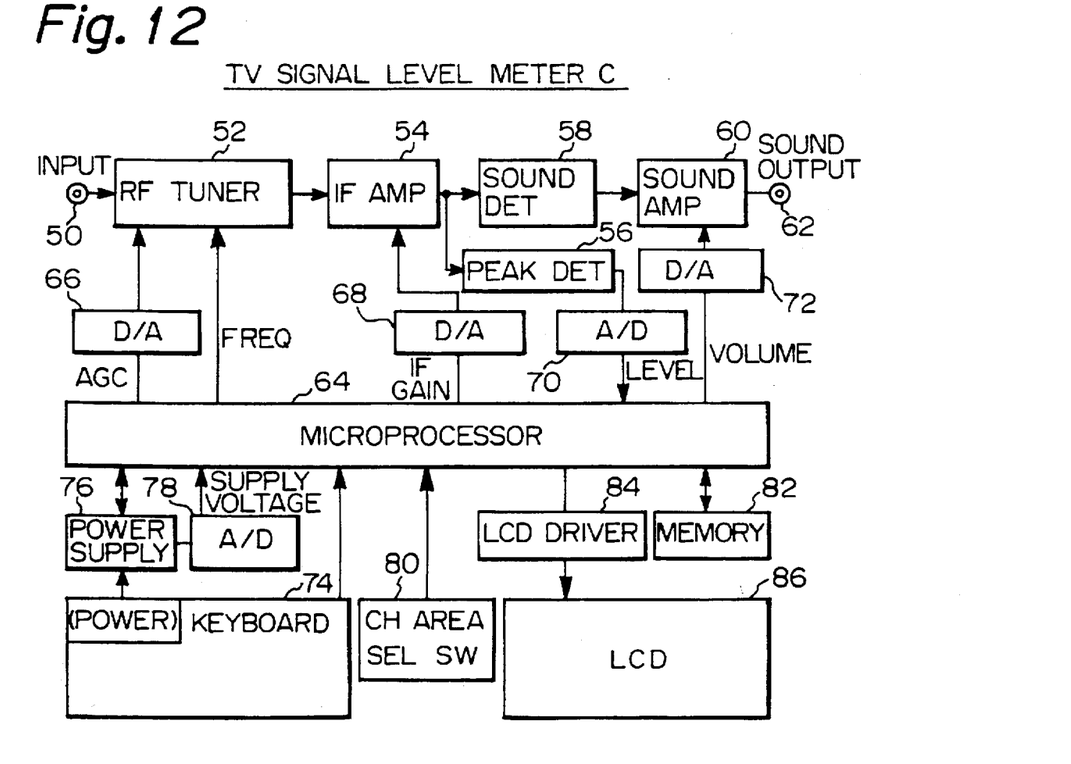
FIG. 12 is a block diagram illustrating the circuit configuration of a TV signal level meter C which incorporates the flow indicator for the indication of a differentiated value according to the present invention shown in FIG. 11.
Figure 13:
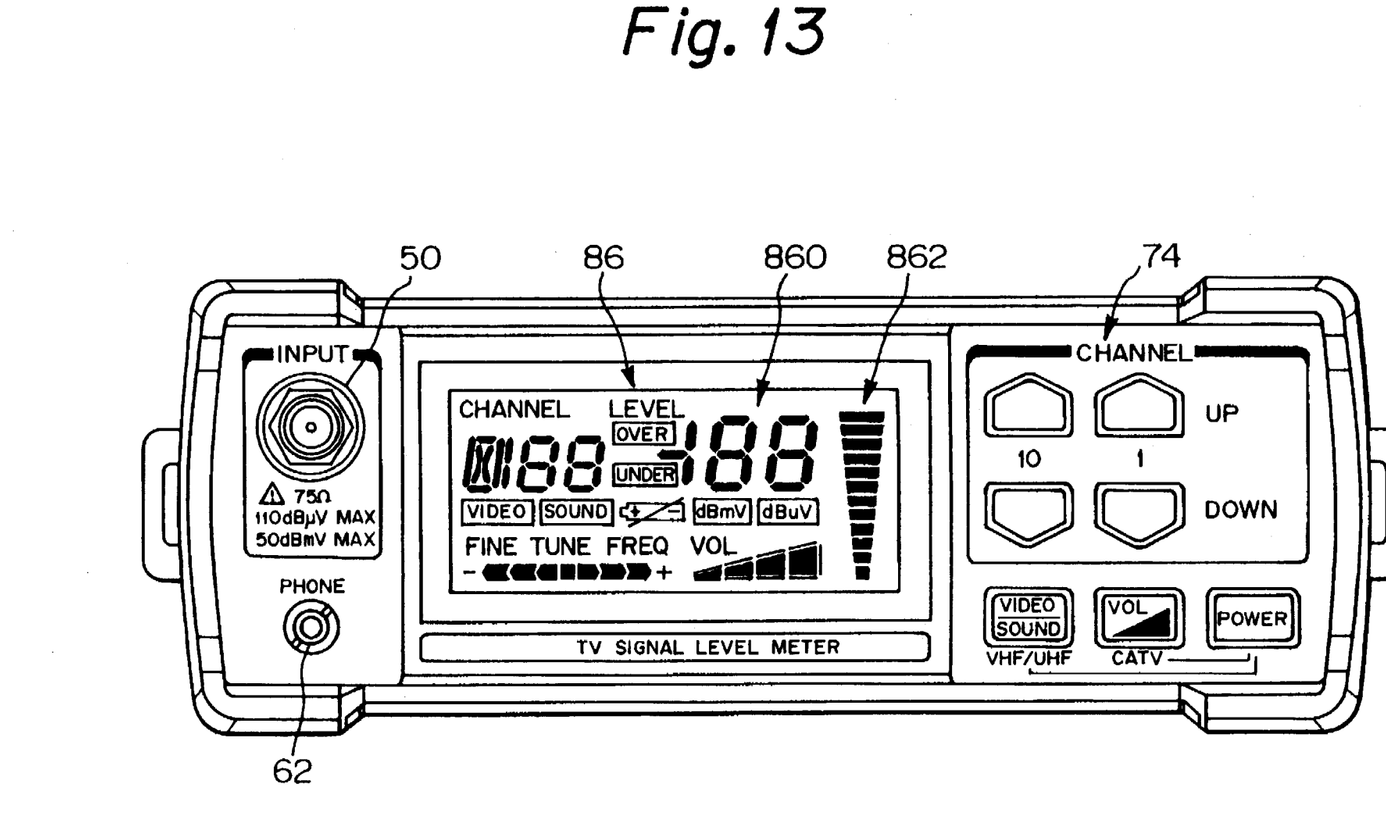
FIG. 13 is a view illustrating the front panel of the TV signal level meter C of FIG. 12.

FIG. 12 is a block diagram illustrating the circuit configuration of the TV signal level meter C, and FIG. 13 is a front view illustrating the front panel of the meter C. The meter C, which is similar in circuit configuration to conventional like meters, comprises, as a signal level measuring circuit, a radio frequency (RF) tuner 52 connected to an input terminal 50; an intermediate frequency (IF) amplifier 54 having an input connected to the output of the tuner 52; a peak detector 56 and a sound detector 58 having respective inputs connected to the output of the amplifier 54; a sound amplifier 60 having an input connected to the output of the detector 58; a sound output terminal 62 connected to the output of the sound amplifier 60; and a microprocessor 64. The sound detector 58 and the amplifier 60 are provided for monitoring sound of TV channels, and the microprocessor 64 is connected to the amplifier 60 through a digital-to-analog (D/A) convertor 72 to adjust the gain of the amplifier 60 for the volume control of the sound.

The microprocessor 64 controls an attenuator in the tuner 52 through a D/A convertor 66 for adjusting the level of a received signal, and directly controls a tuned frequency of the tuner 52 for the selection of a TV channel. Also, the microprocessor 64 controls an attenuator in the IF amplifier 54 through a D/A convertor 68 to adjust the IF gain for adjusting the level of the received signal. Further, the microprocessor 64 receives the output of the peak detector 56 through an analog-to-digital (A/D) convertor 70 for calculating the level of the received signal.

The meter C also includes a keyboard 74 for inputs to the meter C. As illustrated in FIG. 13, the keyboard 74 includes a power (POWER) key; a volume adjusting (VOL) key; video/sound selection (VIDEO/SOUND) key; up/down keys for changing the one's digit of a channel (CHANNEL) number; up/down keys for changing the ten's digit of the channel number; a CATV selection key (which functions when the power key and the volume adjusting key are simultaneously operated); and a VHF/UHF selection key (which functions when the power key and the video/sound selection key are simultaneously operated). The power key is connected to a power supply 76 of the meter C which supplies electric power to the microprocessor 64 and other circuits. The microprocessor 64 receives a voltage from the power supply 76 through an A/D convertor 78 for monitoring the supply voltage. Also, although not shown in FIG. 13, the meter C includes a switch 80 which selects one of channel areas such as countries, regions, or the like for automatic setting of TV channels. The meter C further includes a memory 82 Which stores processing programs for the meter C as well as a table (see FIG. 15) for the flow indicator according to the present invention.

Also, the meter C includes a liquid crystal display (LCD) driver 84 and an STN liquid crystal display (LCD) 86 which displays meter outputs. As can be seen from FIG. 13, the LCD 86 includes a channel number display region and a digital level value display region 860 as well as display regions which display level OVER (excessively high)/ UNDER (excessively low), VIDEO/SOUND, dBµV/dBmV which are units of level values, a residual battery power indication, a tuned frequency fine adjustment (FINE TUNE FREQ), and a volume (VOL). Also, the LCD 86 includes a region 862 for displaying flow images for the flow indicator, similar to that illustrated in FIGS. 2 and 3A–3D. It should be noted that all the liquid display segments in FIG. 13 are illustrated as being in an operated or illuminated state.

Figure 14:
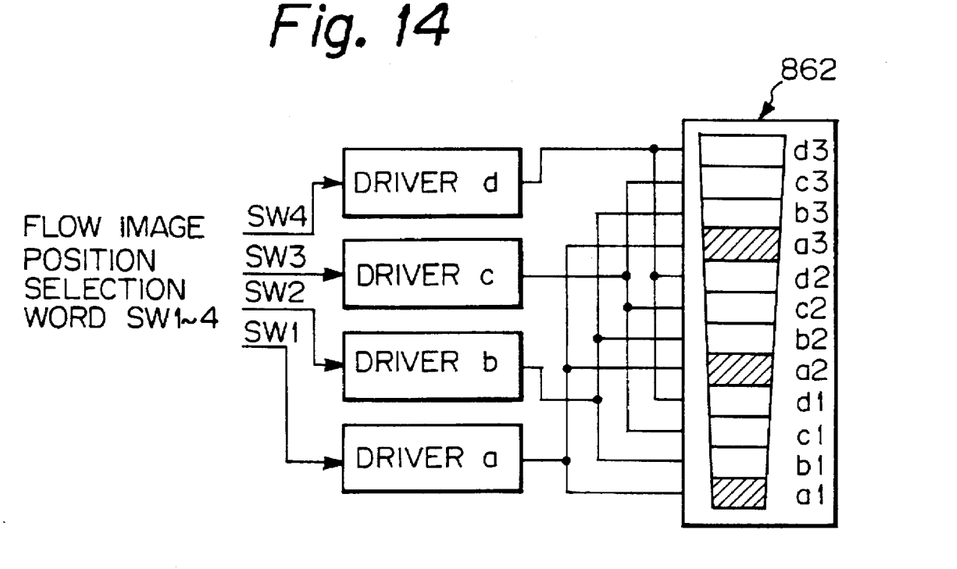
FIG. 14 is a block diagram illustrating only a portion of a liquid crystal driver and a liquid crystal display shown in FIG. 12, which is associated with the flow indicator of the present invention.

FIG. 14 illustrates only the circuit portion of the LCD driver 84 and the LCD 86 which is associated with the flow indicator of the present invention. As illustrated, the flow image display region 862 is composed of 12 display segments a1–d3 which are used to form a three-image-element/ four-position flow image. A driver a connected to segments a1, a2 and a3 controls these segments to turn on and off. Similarly, a driver b controls segments b1, b2 and b3; a driver c controls segments c1, c2 and c3; and a driver d controls segments d1, d2 and d3. The drivers a, b, c and d are connected to the microprocessor 64 to receive a corresponding one of bits SW1–SW4 in a four-bit flow image position selection word SW from the microprocessor 64. In the example, the flow image display is configured to form flow images by LCD segments in OFF state. Thus, in FIG. 14, shaded segments are in OFF state (bright) and other unshaded segments are in ON state (dark).

Figure 15:
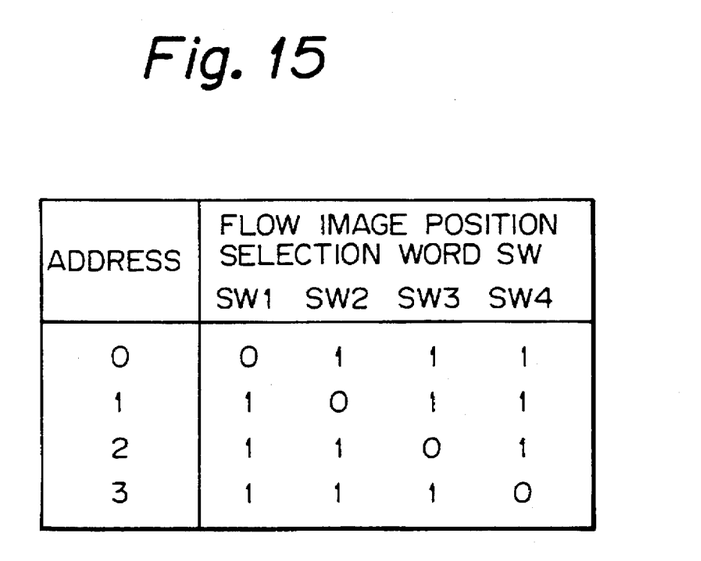
FIG. 15 shows a table for the flow indicator, i.e., a flow image position selecting word table stored in a memory shown in FIG. 12.

FIG. 15 shows a table for the flow indicator, i.e., a flow image position selection word table. When a table address is "0", the selection word bits SW1–SW4 are "0111" which enables the drivers b, c and d but disables the driver a, whereby only the segments a1, a2 and a3 are turned OFF (bright) to form a flow image which is bright compared with surroundings. Similarly, when the table address is "1", the selection bits "1011" cause only the segments b1, b2 and b3 to turn OFF. When the table address is "2", the selection bits "1101" cause only the segments c1, c2 and c3 to turn OFF. When the table address is "3", the selection bits "1110" cause only the segments d1, d2 and d3 to turn OFF. In this way, flow images corresponding to the respective table address values are formed.

Figure 16:
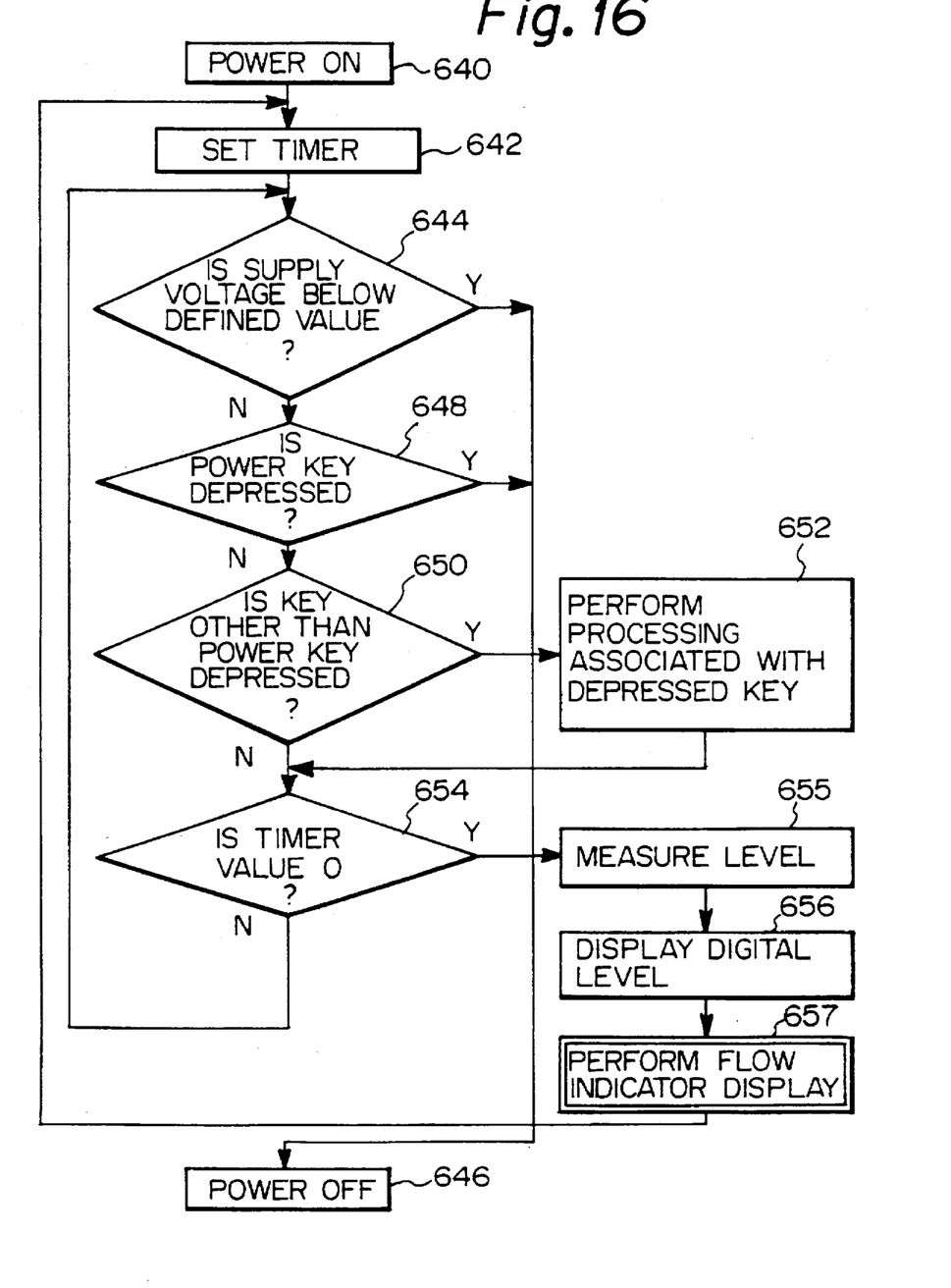
FIG. 16 is a flow chart representing a main flow of operation performed by the meter C of FIG. 12.
Figure 17:
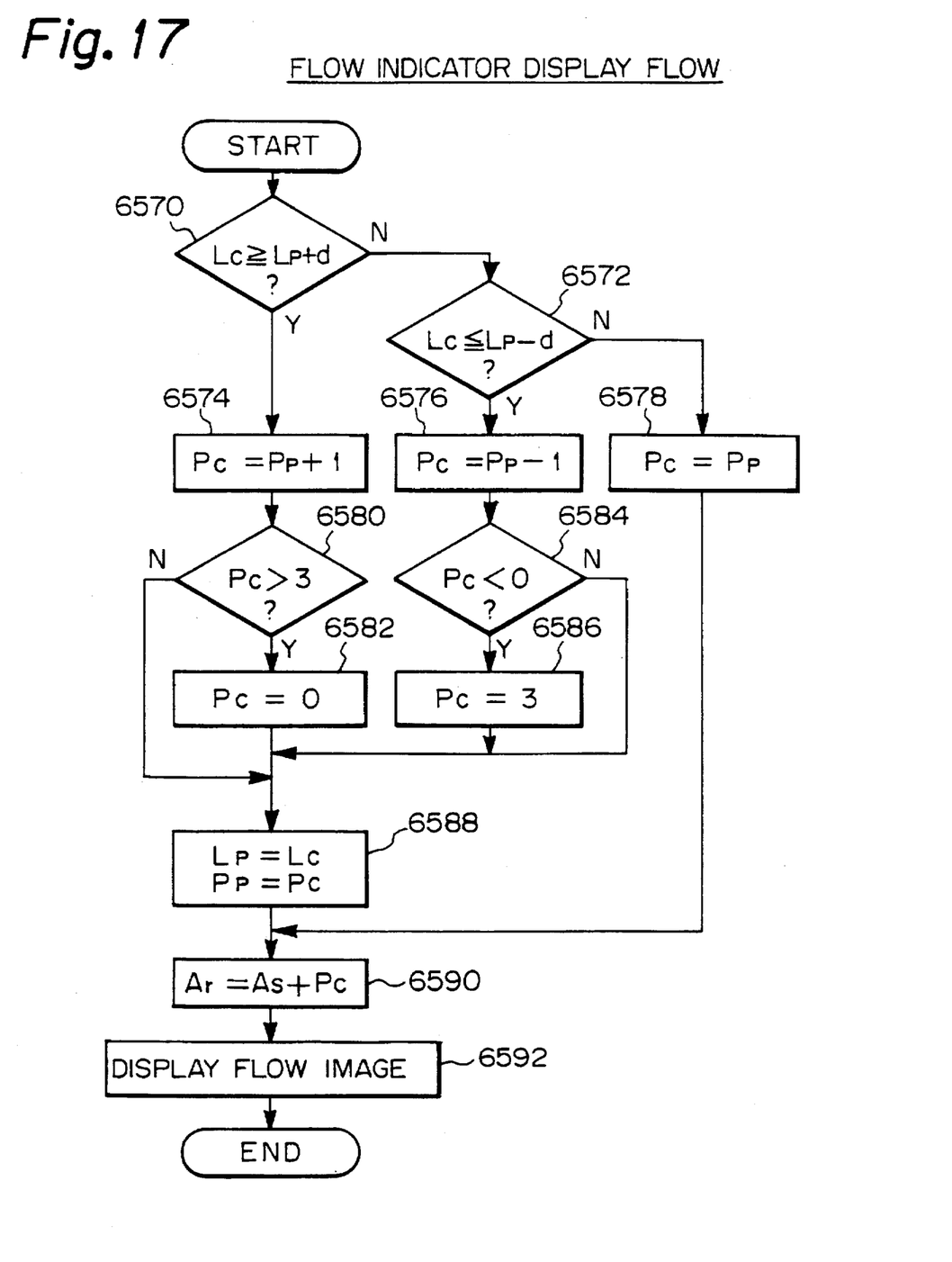
FIG. 17 is a flow cart representing a flow indicator display flow for illustrating details of step 657 in FIG. 16.

Next, with reference to FIGS. 16 and 17, the operation of the meter C will be described. First, FIG. 16 shows a main flow of operation executed by the meter C. When the user depresses the power key to turn the meter C on at initial step 640, the meter C is initialized (although not shown, the initialization includes setting of variety of parameters, default processing, and display processing), and then a 0.1-second timer is set for determining the period of level measurement at next step 642. Then, it is checked at step 644 to determine whether the supply voltage is below a defined value. If YES, i.e., when the supply voltage of the battery is too low, the processing flow proceeds to step 646 where the power supply is turned off to prohibit the user from using the meter C. If NO, it is checked at step 648 to determine whether the power key is depressed. If YES at step 648, it is determined that the user is intending to power off the meter C, followed by the processing flow proceeding to step 646. On the other hand, if NO at step 648, it is checked at step 650 to determine whether a key other than the power key is depressed. If No, the processing flow proceeds to step 654. If YES, the processing flow proceeds to step 652 where the key processing corresponding to the depressed key (including associated display processing) is executed. Subsequently, the processing flow proceeds to step 654, as is the case of NO at step 650. At step 654, it is checked to determine whether the timer value reaches zero. If NO, the processing flow jumps back to step 644.

If YES at step 654, the processing flow proceeds to steps 655–657 where measurement and display processing is performed. More specifically, at step 655, a level measurement is performed on a selected channel while controlling the RF tuner 52 or the IF amplifier 54 as required. At step 656, the measured level value is displayed on the digital display region 860 in a digital format, i.e., in numerical value. At step 657, indication by the flow indicator of the present invention is provided on the flow image display region 862. When the step 657 is completed, the processing flow jumps back to step 642 to repeat the foregoing steps 642–657.

Now, with reference to FIG. 17, a flow indicator display flow which represents in detail a sequence of operations performed at step 657 in FIG. 16, will be described. At the first two steps 6570 and 6572, a current measured level value Lc is compared with a previous measured level value Lp to determine the magnitude relationship therebetween. Here, the level values Lc and Lp are represented in the unit of dBµV, and a threshold d is set at 0.2 dBµV, by way of example. If the current level Lc satisfies Lc≧Lp+d, i.e., if the flow of image should be moved upwardly, YES results at step 6770, causing the processing flow to proceed to step 6574. If the current level Lc satisfies Lc≦Lp−d, i.e., if the flow of image should be moved downwardly, NO branching results at step 6750 followed by YES branching at step 6572, causing the processing flow to proceed to step 6576. Also, if the value Lc satisfies Lp+d>Lc>Lp−d, i.e., the flow of image should be stopped, NO branching results at step 6572, causing the processing flow to proceed to step 6578.

Steps 6574–6590 look up the flow indicator table shown in FIG. 15. As seen from FIG. 15, the flow indicator table has four addresses 0–3, where the flow of image is moved upwardly as the address is increased from 0 to 3. Steps 6574–6582 move the flow of image upwardly. Specifically, at first step 6574, a current address pointer Pc is set equal to a previous address pointer Pp incremented by one. It is checked at next step 6580 to determine whether the value Pc is larger than three. If the value Pc is equal to or less than three, the processing flow bypasses step 6582 to proceed to step 6588. If the value Pc is larger than three, the value Pc is set equal to zero at step 6582 to return the selected flow image position to the lowest one, followed by the processing flow proceeding to step 6588. At step 6588, the value Lp is updated to be equal to the value Lc, while the value Pp is updated to be equal to the value Pc, making preparations for the next flow indicator display processing. Steps 6576–6586 move the flow of image downwardly. Specifically, at first step 6576, the current address pointer Pc is set equal to the previous address pointer Pp decremented by one. It is checked at next step 6584 to determine whether the value Pc is less than zero. If the value Pc is equal to or more than zero, the processing flow bypasses the step 6586 to proceed to step 6588. If the value Pc is less than zero, the value Pc is set equal to three at step 8586 to return the selected flow image position to the highest one, followed by the processing flow proceeding to step 6588. Step 6578 provides processing for stopping the flow of image, where the value Pc is set equal to the value Pp. Subsequently, the processing flow directly proceeds to step 6590 without passing step 6588. Thus, since the values Lp and Pp are left unchanged, the same values Lp and Pp as those in the current flow indicator display processing are used in the next processing.

Step 6590 calculates a physical address used to retrieve the flow indicator table stored in the memory 82, wherein a read-out physical address Ar is set equal to a start physical address As of the table plus the value Pc. Next, at step 6592, a four-bit flow image position selection word SW is retrieved from the calculated physical address Ar and outputted to the drivers a–d (FIG. 14). The drivers enable or disable associated display segments in accordance with the states of the bits of the retrieved selection word to display a flow image in the display region 862. The display is maintained until the next input is received. The processing flow is now terminated.

Figure 18:
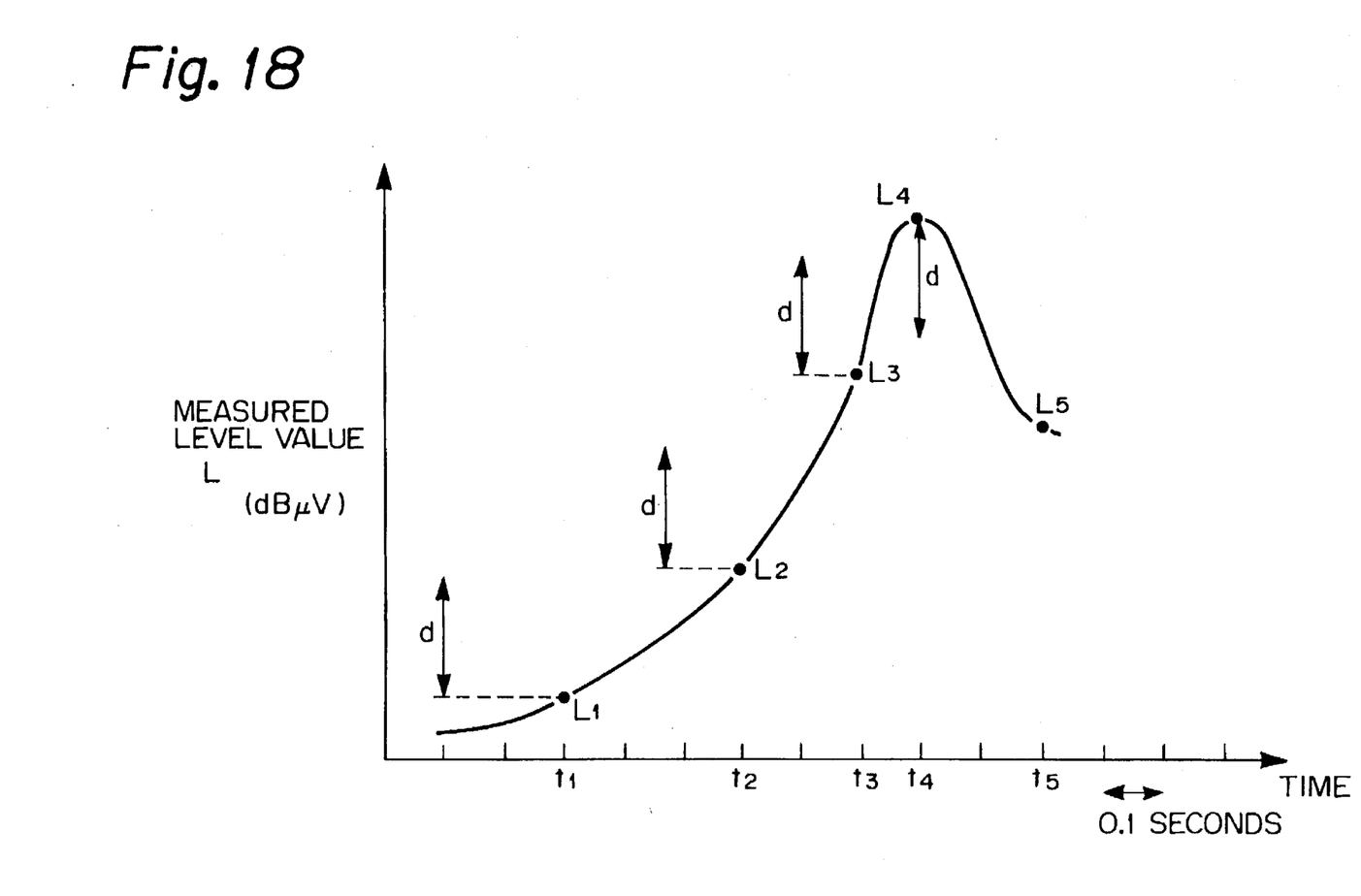
FIG. 18 is a graph plotting measured level values of a physical quantity for explaining the operation of a flow indicator portion of the meter C shown in FIG. 12, where the abscissa represents the time graduated at intervals of 0.1 seconds.

Next, with reference to FIG. 18, the operation of the flow indicator portion of the meter C will be described. It is assumed first that a measured level value L provided by the meter C changes as illustrated in FIG. 18, wherein the abscissa represents the time graduated at intervals of 0.1 seconds which are equal to the measurement period selected at 0.1 seconds (implemented by the 0.1 second timer at step 642 in FIG. 16), while d represents the aforementioned threshold. Explaining first the operation of the meter C after time t1 at which the measured level is L1, a measured level at 0.1 seconds after time t1 is not higher than the previous level L1 by the threshold d or more. This causes the processing flow in FIG. 17 to pass steps in the order of 6570→6572→6578→6590. Thus, assuming that flow image at time t1 is located at the position c1-3 in FIG. 14, the flow image remains at the same position. Since a measured level at 0.2 seconds after time t1 is similar, the flow image does not move. At time t2, 0.3 seconds after time t1, the measure level presents an increase of d or more from the level L1, the processing flow in FIG. 17 passes steps in the order of 6570→6574→6580→6588→6590. Consequently, the flow image is shifted one position upwardly to the position d1-3 in FIG. 14. After time t2, a measured level at t3, 0.2 seconds after time t2, presents an increase of d or more from the level L2. In this case, the processing flow in FIG. 17 passes steps in the order of 6570→6574→6580→6582→6588→6590, whereby the flow image is shifted to the lowest positions a1-3. After time t3, a measured level after 0.1 seconds presents an increase of d or more from the level L3, causing the flow image to shift one position upwardly to the position b1-3. From time t4 on, the measured level begins decreasing, and a level L5 at time t5, 0.2 seconds after time t4, presents a decrease of d or more from the level L4. This causes the processing flow in FIG. 17 to pass steps in the order of 6570→6572→6576→6584→6588→6590, whereby the flow image is shifted downwardly to the position a1-3.

As will be understood from the foregoing description, the direction of movement of the flow image depends on the polarity of the differential of a measured level, and the speed of movement is proportional to the magnitude of the differential. It should be noted that in FIG. 18, the threshold d is given a relatively large value with the level L being measured at longer intervals for facilitating the illustration. If a smaller threshold value d and shorter measuring intervals are selected, the flow of image more closely corresponding to the differential can be provided. This allows the user to more easily find a maximum point of a received signal level.

In the flow indicator portion of the TV signal level meter C as described above, a variety of modifications may be made, similarly to those described in connection with the flow indicator A, so that an optimal flow representation can be provided in accordance with particular applications and purposes. Also, when the flow indicator is modified so as to indicate the difference between a measured value and a target or reference value, instead of a differentiated value, the degree of approach to the target value or the like can be indicated in the form of flow. Also, while the meter C employs a liquid crystal display for the display means, the liquid crystal display may be replaced by a CRT display or any other display device on which the flow indicator is displayed.

According to the flow image indicating method and apparatus of the present invention as described above, changes in the value of a physical quantity can be readily grasped, and the area required for displaying the indication can be reduced. Also, the use of the differential indication allows the user to easily know the velocity of variation of the value of a physical quantity and hence determine a maximum and/or minimum point of the value. When a difference value is indicated instead of a differential value, the degree of approach of the value of a physical quantity under measurement to a target value can be easily determined. Further, the flow image indicator combined with a digital display indicator can constitute an indicator which provides the user with a variety of information in a readily identifiable form.

What is claimed is:

1. A method of indicating a value of a predetermined physical quantity in a form of flow representation, said value having a polarity and a magnitude, said method comprising the steps of:

defining a flow representing image for representing a flow;

indicating the polarity of said value by at least one direction of flow of said flow representing image along a predetermined line; and indicating the magnitude of said value by a speed of flow of said flow representing image.

2. A method according to claim 1, wherein:
said flow representing image comprises at least one image element movable along said predetermined line.

3. A method according to claim 2, wherein:
said at least one image element comprises a plurality of image elements spaced apart from each other.

4. A method according to claim 3, wherein:
said plurality of image elements are spaced at uniform or non-uniform intervals.

5. A method according to claim 2, wherein:
said at least one image element is bright or dark relative to surroundings.

6. A method according to claim 2, wherein:
said at least one image element has a uniform or similar shape or a non-uniform or dissimilar shape along said predetermined line.

7. A method according to claim 2, wherein:
said at least one image element has a uniform or non-uniform size along said predetermined line.

8. A method according to claim 1, wherein:
said predetermined line is a straight line, a curved line, or a radial line.

9. A method according to claim 1, wherein:
said at least one direction of flow comprises two directions opposite to each other along said predetermined line, one of said two directions representing a positive polarity, the other of said two directions representing a negative polarity.

10. A method according to claim 1, wherein:
said speed of flow of said flow representing image has a linear or non-linear relationship with the magnitude of the value of said physical quantity.

11. A method according to claim 1, wherein:
said flow representing image is repetitively moved over a finite distance.

12. A method according to claim 1, wherein:
the polarity of the value of said physical quantity represents a polarity relative to a predetermined reference value.

13. A method according to claim 1, wherein:
the value of said physical quantity is a differentiated value of said physical quantity.

14. A flow display type indicator for indicating a value of a predetermined physical quantity, comprising:
an input terminal for receiving an input signal representative of a value of said predetermined physical quantity;
flow representing image forming means for forming a flow representing image at an n number of different positions along a predetermined line, said n positions comprising first to n-th positions orderly disposed and being offset from each other, said first position defining a next position to said n-th position in a first direction, said n-th position defining a next position to said first position in a second direction opposite to said first direction; and
flow representing image selecting means connected to said flow representing image forming means, for selecting said flow representing images at said first to n-th positions in one of said first and second directions depending on a polarity of a first signal received from said input terminal and at a speed in accordance with a magnitude of said first signal, in order to cause said flow representing image forming means to form the selected flow representing image.

15. An indicator according to claim 14, wherein:
said flow representing image selecting means is connected to said input terminal for receiving an input signal received at said input terminal as said first signal.

16. An indicator according to claim 14, further comprising:
differentiating means connected between said input terminal for receiving a value of said predetermined physical quantity and said flow representing image selecting means, for generating a differential of the value of said predetermined physical quantity and for supplying said flow representing image selecting means with said differential value as said first signal, whereby said indicator is operative to indicate a velocity of variation of the value of said predetermined physical quantity.

17. An indicator according to claim 14, wherein said flow representing image selecting means includes:
polarity detector means for detecting a polarity of said first signal relative to a predetermined reference value to generate a polarity signal representative of the detected polarity;
magnitude detector means for detecting a magnitude of said first signal relative to said predetermined reference value to generate a magnitude signal representative of the detected magnitude; and
flow representing image position selector means connected to receive said polarity signal and said magnitude signal and having an output connected to said flow representing image forming means, said selector means being responsive to said polarity signal and said magnitude signal to generate a position selecting signal for selecting one from said first to n-th positions of said flow representing images in one of said first and second directions depending on the polarity represented by said polarity signal and at a speed in accordance with the magnitude represented by said magnitude signal, whereby said flow representing image forming means receives said position selecting signal to form said flow representing image at one of the positions represented by said position selecting signal.

18. An indicator according to claim 14, wherein said flow representing image forming means includes:
a T number of a plurality of display segments arranged along said predetermined line; and
control means for controlling said T display segments to form at least one image element movable along said predetermined line.

19. An indicator according to claim 18, wherein:
said predetermined line is a straight line, and said T display segments being arranged along said straight line.

20. An indicator according to claim 18, wherein:
said predetermined line is a curved line, and said T display segments being arranged along said curved line.

21. An indicator according to claim 18, wherein:
said predetermined line is a radial line, and said T display segments being arranged along said radial line.

22. An indicator according to claim 18, wherein:
said at least one image element comprises a plurality of an m number of a plurality of image elements spaced apart from each other;
said T being equal to said n multiplied by said m; and
said T segments being divided into an m number of groups each including an n number of display segments.

23. An indicator according to claim 22, wherein:

said plurality of image elements are spaced at uniform or non-uniform intervals.

24. An indicator according to claim 18, wherein:

said at least one image element is bright or dark relative to surroundings, and each of said display segments forming a bright or dark image element when the each display segment is enabled.

25. An indicator according to claim 18, wherein:

said at least one image element has a uniform or similar shape or a non-uniform or dissimilar shape along said predetermined line.

26. An indicator according to claim 18, wherein:

said at least one image element has a uniform or non-uniform size along said predetermined line.

27. An indicator according to claim 14, wherein:

said first and second directions are two directions opposite to each other along said predetermined line, one of said two directions representing a positive polarity, the other of said two directions representing a negative polarity.

28. An indicator according to claim 14, wherein:

said speed has a linear or non-linear relationship with the magnitude of the first signal.

29. An indicator according to claim 14, wherein:

said flow representing image is repetitively moved over a finite distance.

* * * * *